United States Patent

Shih et al.

(10) Patent No.: US 8,846,499 B2
(45) Date of Patent: Sep. 30, 2014

(54) COMPOSITE CARRIER STRUCTURE

(75) Inventors: Ying-Ching Shih, Taipei (TW);
Weng-Jin Wu, Hsin-Chu (TW);
Jing-Cheng Lin, Hsin-Chu (TW);
Wen-Chih Chiou, Miaoli (TW);
Shin-Puu Jeng, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 436 days.

(21) Appl. No.: 12/858,211

(22) Filed: Aug. 17, 2010

(65) Prior Publication Data

US 2012/0045611 A1  Feb. 23, 2012

(51) Int. Cl.
*H01L 21/30* (2006.01)
(52) U.S. Cl.
USPC .......................................... 438/464; 438/109
(58) Field of Classification Search
USPC .................. 438/109, 455, 458, 464
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,780,733 B2 * | 8/2004 | Chason et al. | 438/464 |
| 6,800,930 B2 | 10/2004 | Jackson et al. | |
| 6,841,883 B1 | 1/2005 | Farnworth et al. | |
| 6,852,608 B2 * | 2/2005 | Kitamura et al. | 438/464 |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2009/0302435 A1 * | 12/2009 | Pagaila et al. | 257/659 |
| 2010/0029032 A1 * | 2/2010 | Kim | 438/63 |

* cited by examiner

Primary Examiner — Reema Patel
(74) Attorney, Agent, or Firm — Slater and Matsil, L.L.P.

(57) ABSTRACT

A composite carrier structure for manufacturing semiconductor devices is provided. The composite carrier structure utilizes multiple carrier substrates, e.g., glass or silicon substrates, coupled together by interposed adhesive layers. The composite carrier structure may be attached to a wafer or a die for, e.g., backside processing, such as thinning processes. In an embodiment, the composite carrier structure comprises a first carrier substrate having through-substrate vias formed therethrough. The first substrate is attached to a second substrate using an adhesive such that the adhesive may extend into the through-substrate vias.

21 Claims, 2 Drawing Sheets

COMPOSITE CARRIER STRUCTURE

TECHNICAL FIELD

This disclosure relates generally to semiconductor devices and, more specifically, to a carrier structure for use in semiconductor fabrication.

BACKGROUND

Semiconductor devices are fabricated by forming active devices on or within a semiconductor wafer. Hundreds or thousands of integrated circuits or die are typically manufactured on a single wafer. Typically, a plurality of insulating, conductive, and semiconductive material layers are sequentially deposited and patterned over the wafer to form the integrated circuits. One of the uppermost-formed material layers typically comprises a layer for bond pads which make electrical connection to the underlying active areas and components within the wafer.

After the integrated circuits are formed, the wafer is subjected to backside processing. The backside processing may include thinning the wafer to prepare the wafer for packaging. For example, in some technologies, backside processing may include forming electrical connections to through-substrate vias formed through the wafer for providing backside contacts. In this example, the backside of the wafer is thinned through a process such as grinding in order to expose the conductive vias on the backside of the wafer. This process of thinning the wafer can damage the edges of the wafer and can make the wafer even more fragile and susceptible to damage during subsequent transportation and processing of the wafer.

To help alleviate these types of damage, a carrier substrate is normally attached to the wafer. This carrier substrate is attached using an adhesive, and is intended to allow handling of the wafer by handling the carrier substrate. Additionally, the added strength of the carrier substrate supports the wafer so that stresses caused by transportation and/or processing will not damage the wafer.

A typical carrier substrate consists of a glass substrate attached to the wafer using an adhesive. It has been found, however, that the wafer may warp during processing and that the typical carrier substrate does not provide sufficient support to prevent warping. As a result of the warpage of the wafer, processes may fail and/or cause alarm conditions.

SUMMARY

These and other problems are generally reduced, solved, or circumvented, and technical advantages are generally achieved, by embodiments discussed herein, which provide a composite carrier structure.

In an embodiment, the composite carrier structure has one or more carrier substrates, e.g., glass or silicon substrates, and one or more adhesive layers. The composite carrier structure may be attached to a wafer or a die for, e.g., backside processing, such as thinning processes. In an embodiment, the composite carrier structure comprises a first carrier substrate attached to a second carrier substrate by an adhesive layer.

In another embodiment, the composite carrier structure includes at least one carrier substrate having through-substrate vias formed therethrough. The carrier substrate having the through-substrate vias may be attached to another carrier substrate using an adhesive such that the adhesive protrudes through the through-substrate vias to attach the composite carrier structure to a wafer.

In yet another embodiment, the composite carrier structure has an internal adhesive layer.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use embodiments, and do not limit the scope of this disclosure.

The following embodiments are described in a specific context, namely a composite carrier structure for attaching to a semiconductor wafer for the purpose of performing backside processing. Other embodiments, however, may be used in other situations. For example, a composite carrier structure may be utilized to provide support during front side processing. As another example, a composite carrier structure may be used to process individual dies after singulation. Embodiments described herein may be used in any number of situations in which additional support is desirable.

Figure 1:
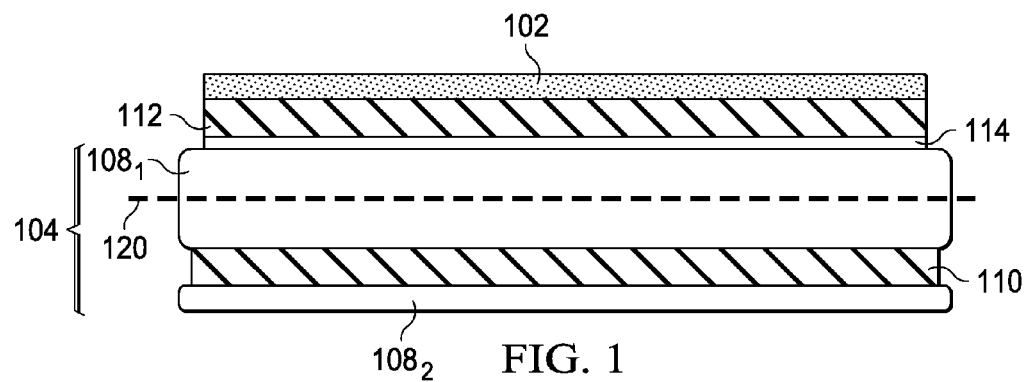
FIG. 1 is a composite carrier structure in accordance with an embodiment.

Referring first to FIG. 1, there is shown a wafer 102 attached to a composite carrier structure 104 in accordance with an embodiment. The wafer 102 may be a semiconductor substrate, such as a bulk silicon substrate or a semiconductor-on-insulator substrate, although it may include other semiconductor materials, such as group III, group IV, and/or group V elements, as well. Integrated circuitry (not shown) formed on the wafer 102 may be any type of circuitry suitable for a particular application. In an embodiment, the integrated circuitry includes electrical devices formed on the wafer 102 with one or more dielectric layers overlying the electrical devices. Metal layers may be formed between dielectric layers to route electrical signals between the electrical devices. Electrical devices may also be formed in one or more dielectric layers.

The composite carrier structure 104 comprises a plurality of carrier substrates, a first carrier substrate $108_1$ and a second carrier substrate $108_2$ being shown in FIG. 1. The plurality of carrier substrates is collectively referred to as carrier substrates 108. In an embodiment, the first carrier substrate $108_1$ and the second carrier substrate $108_2$ are coupled together using a first adhesive layer 110. Each of the plurality of carrier substrates 108 may comprise, for example, glass, silicon, silicon oxide, aluminum oxide, combinations of these, and/or the like.

The wafer 102 is attached to the composite carrier structure 104 using a second adhesive layer 112. The first adhesive layer 110 and the second adhesive layer 112 may be, for example, a thermally cured adhesive. This type of adhesive is applied by, for example, spin coating the adhesive to one or more of the surfaces to be joined. The surfaces to be joined are brought together, and a suitable thermal process may be performed to cure the adhesive, thereby bonding the wafer 102 to the first carrier substrate $108_1$. Thereafter, backside processing (or other processing) may be performed on the wafer 102, wherein the composite carrier structure 104 provides additional support.

To aid in the removal of the composite carrier structure 104 after the backside processing has been completed, an optional light-sensitive material layer 114, e.g., a light-to-heat conversion (LTHC) coating, may be applied to the bonding surface of the first carrier substrate $108_1$. In this manner, once the backside processing has been completed, a debonding process may be performed on the composite structure of the wafer 102 and the composite carrier structure 104. A debonding process may be, for example, exposing the composite structure of the wafer 102 and the composite carrier structure 104 to a suitable laser or other light source. The laser energy decomposes the LTHC layer, thereby allowing the composite carrier structure 104 to be separated from the wafer 102. The remnants of the second adhesive layer 112 may be removed by a suitable detaping process or by using a suitable chemical solvent.

The use of the optional light-sensitive material layer 114 allows the wafer 102 to be separated from the composite carrier structure 104 without separating the first carrier substrate $108_1$ and the second carrier substrate $108_2$. In another embodiment, heat sensitive adhesives may be used for the first adhesive layer 110 and the second adhesive layer 112. In this embodiment, the composite carrier structure 104 may be separated from the wafer 102 by performing a heat treatment that softens the second adhesive layer 112, but not the first adhesive layer 110. For example, the first adhesive layer 110 may be HD-series adhesives, manufactured by Hitachi DuPont Microsystems, LLC, which may be removed by heating to a temperature of 250° C., while the second adhesive layer 112 may be HT-series adhesives, manufactured by Brewer Science, Inc., which may be removed by heating to a temperature of ~200° C. This example allows heating to ~200° C. to soften the second adhesive layer 112, without adversely affecting the first adhesive layer 110.

The thicknesses of the adhesive layers and carrier substrates may be varied dependent upon the particular application. For example, a thickness of the second adhesive layer 112 may be varied to account for different sizes of bumps/balls that may already be attached to the wafer 102. Furthermore, thicknesses of the first carrier substrate $108_1$ and the second carrier substrate $108_2$ may be varied to account for different warpage characteristics.

It should also be noted that embodiments such as those disclosed herein provide a generally symmetric structure about dotted line 120. In particular, the second carrier substrate $108_2$ is symmetric with the wafer 102, and the first adhesive layer 110 is symmetric with the second adhesive layer 112. It has been found that such a symmetric structure prevents and/or reduces warpage during processing. For example, in an embodiment, the first carrier substrate $108_1$ has a thickness of about 500 μm, the second carrier substrate $108_2$ has a thickness of about 50 μm, and the first and second adhesive layers 110,112 have a thickness of about 100 μm to about 200 μm. In this embodiment, the wafer may have a thickness of 50 μm, about the same as the second carrier substrate $108_2$.

Figure 2:
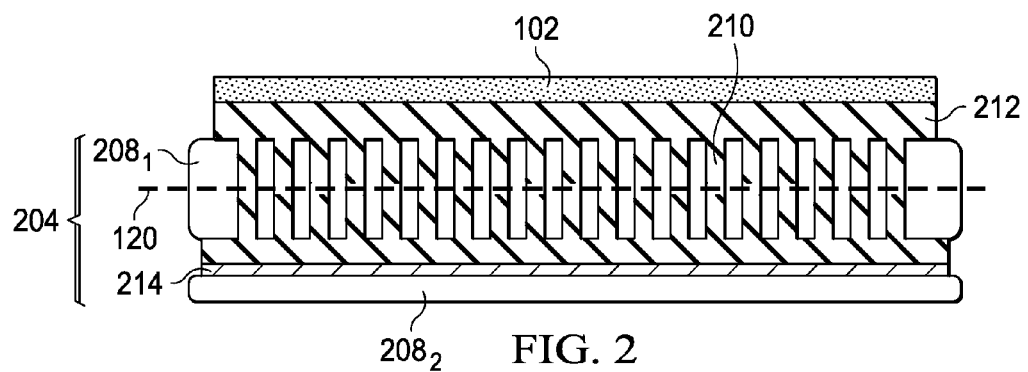
FIG. 2 is a composite carrier structure in accordance with another embodiment.

FIG. 2 illustrates a composite carrier structure 204 in accordance with another embodiment, wherein like reference numerals refer to like elements. As illustrated in FIG. 2, the composite carrier structure 204 includes a plurality of carrier substrates, a first carrier substrate $208_1$ and a second carrier substrate $208_2$ being shown in FIG. 2. The plurality of carrier substrates is collectively referred to as carrier substrates 208.

The first carrier substrate $208_1$ includes a plurality of through-substrate vias 210 formed therethrough. The through-substrate vias 210 may be formed by any appropriate method. For example, openings may be formed extending into a first side of a carrier substrate by, for example, one or more photolithography/etching processes, milling, laser techniques, or the like. Thereafter, an opposing second side of the carrier substrate may be thinned, thereby forming the first carrier substrate $208_1$ having through-substrate vias 210 as illustrated in FIG. 2.

The wafer 102 may be attached to the composite carrier structure 204 by applying, e.g., by spin-coating, the adhesive layer 212 to the wafer 102 and the first carrier substrate $208_1$. The adhesive layer 212 may be forced into through-substrate vias 210 by applying the adhesive in a vacuum. A light-sensitive layer 214, e.g., LTHC, is applied to the second carrier substrate $208_2$, and the second carrier substrate $208_2$ is attached to the first carrier substrate $208_1$.

To remove the wafer 102, a debonding process, such as, for example, exposing the composite structure of the wafer 102 and the composite carrier structure 204 to a suitable laser or other light source to decompose the light-sensitive layer 214, may be performed. After separating the second carrier substrate $208_2$, a chemical solvent may be used to remove the adhesive layer 212. In this embodiment, the through-substrate vias 210 act to allow the chemical solvent to better reach internal areas of the wafer 102, thereby reducing the risk of damage to the wafer 102 during separation.

Figure 3:
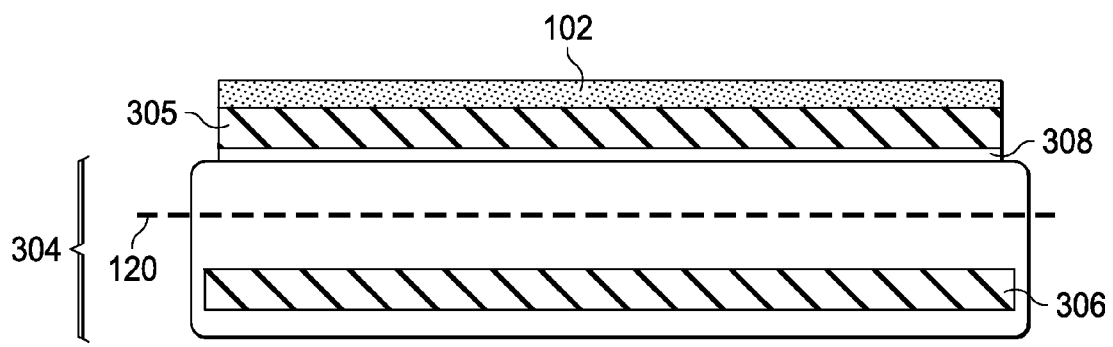
FIG. 3 is a composite carrier structure in accordance with yet another embodiment.

FIG. 3 illustrates a composite carrier structure 304 attached to the wafer 102 by an adhesive 305 in accordance with another embodiment, wherein like reference numerals refer to like elements. In this embodiment, the composite carrier structure 304 comprises an internal adhesive layer 306. This embodiment may have an added advantage in that the internal adhesive layer 306 is protected during processing. For example, the internal adhesive layer 306 is protected from chemical solvents that may be used to remove the adhesive 305 to separate the wafer 102 from the composite carrier structure 304.

To attach the wafer 102 to the composite carrier structure 304, an optional light-sensitive layer 308, e.g., LTHC, may be applied to the composite carrier structure 304. The adhesive 305 is applied to the wafer 102 and the wafer 102 and the composite carrier structure 304 are brought together. A UV, thermal, or other curing process may be performed to cure the adhesive 305.

To remove the composite carrier structure 304, a debonding process, such as, for example, exposing the composite structure of the wafer 102 and the composite carrier structure 304 to a suitable laser or other light source to decompose the light-sensitive layer 308, may be performed. After separating the composite carrier structure 304, a chemical solvent may be used to remove the adhesive layer 305.

Alternatively, particularly if the light-sensitive layer 308 is not used, a chemical solvent may be used to debond the wafer 102 from the composite carrier structure 304. As noted above, because the internal adhesive layer 306 is protected from the chemical solvents, the composite carrier structure 304 is not damaged and may be reused.

Figure 4:
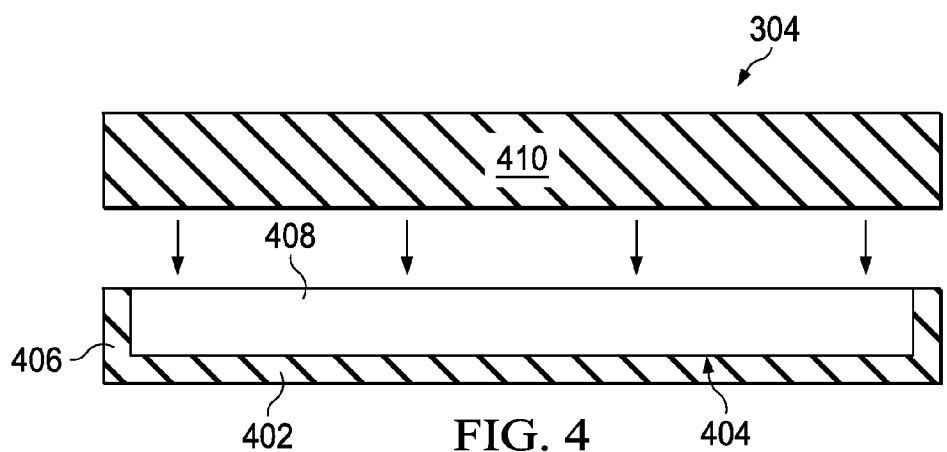
FIG. 4 is an expanded view of the composite carrier structure of FIG. 3 in accordance with an embodiment.

FIG. 4 illustrates an embodiment of forming the composite carrier structure 304. A first carrier substrate 402 has a recessed central region 404 and an exterior region 406. The recessed central region 404 may be formed using, for example, a masking and etching process. A photoresist layer (not shown) may be formed and patterned on a carrier substrate to expose the recessed central region 404 while protecting the exterior region 406. Then, with the exterior region 406 protected, a suitable etchant may be used to thin the exposed recessed central region 404 while maintaining the thickness of the exterior region 406, thereby creating the first carrier substrate 402. The recessed central region 404 may have a depth of about 20 μm to about 300 μm.

The recessed central region 404 may be filled with an adhesive material 408, and the second carrier substrate 410 is placed over the first carrier substrate 402, thereby creating the internal adhesive layer 306 as shown in FIG. 3.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a first substrate;
   providing a carrier structure, the carrier structure comprising a first carrier substrate and a second carrier substrate, the first carrier substrate being thicker than the second carrier substrate, a first adhesive being interposed between the first carrier substrate and the second carrier substrate, the first carrier substrate and the second carrier substrate being rigid;
   attaching the first substrate to a first surface of the carrier structure, one of the first carrier substrate and the second carrier substrate having a larger difference in thickness from the first substrate being interposed between the other of the one of the first carrier substrate and the second carrier substrate and the first substrate; and
   processing the first substrate, the first carrier substrate and the second carrier substrate not providing electrical functionality to the first substrate.

2. The method of claim 1, wherein the carrier structure includes at least one internal adhesive layer.

3. The method of claim 2, wherein the internal adhesive layer has a thickness from about 20 μm to about 300 μm.

4. The method of claim 1, further comprising coating the first surface of the carrier structure with a light-sensitive material prior to the attaching.

5. The method of claim 4, further comprising removing the carrier structure, the removing being performed at least in part by lasing the carrier structure to decompose the light-sensitive material.

6. The method of claim 1, wherein the first carrier substrate having a plurality of through-substrate vias.

7. The method of claim 6, further comprising a light-sensitive material being interposed between the first carrier substrate and the second carrier substrate.

8. The method of claim 1, wherein the attaching the first substrate to the first surface of the carrier structure is performed at least in part by using a second adhesive.

9. The method of claim 8, wherein the first adhesive is different from the second adhesive.

10. The method of claim 8, wherein the second adhesive comprises a light-dissolved material.

11. The method of claim 7, further comprising removing the second carrier substrate from the first carrier substrate, the removing being performed at least in part by lasing the carrier structure to decompose the light-sensitive material.

12. A method of forming a semiconductor device, the method comprising:
    providing a first carrier substrate, the first carrier substrate having an opening therein extending from a first surface to a second surface of the first carrier substrate;
    attaching a second carrier substrate to the first carrier substrate using an adhesive layer, the adhesive layer extending through the opening from the first surface to the second surface of the first carrier substrate; and
    attaching a substrate to the first carrier substrate on a side opposite of the second carrier substrate.

13. The method of claim 12, further comprising providing a light-sensitive material being interposed between the first carrier substrate and the second carrier substrate.

14. The method of claim 13, further comprising separating the first carrier substrate from the second carrier substrate by at least in part exposing the light-sensitive material to a light source.

15. The method of claim 12, wherein the first carrier substrate comprises a plurality of openings extending from the first surface to the second surface of the first carrier substrate, the adhesive layer extending through the plurality of openings.

16. A method of forming a semiconductor device, the method comprising:
    providing a first substrate;
    providing a carrier structure, the carrier structure comprising a first carrier substrate and a second carrier substrate, the first carrier substrate having a first thickness, the second carrier having a second thickness, the first thickness being closer to a thickness of the first substrate than the second thickness, a first adhesive being interposed between the first carrier substrate and the second carrier substrate;
    attaching the first substrate to a first surface of the carrier structure such that the second carrier substrate is interposed between the first substrate and the first carrier substrate, the second carrier substrate being rigid; and
    processing the first substrate while the first substrate is attached to the first carrier substrate and the second carrier substrate.

17. The method of claim 16, wherein the carrier structure includes at least one internal adhesive layer.

18. The method of claim 16, wherein the first carrier substrate has a plurality of through-substrate vias.

19. The method of claim 18, further comprising a light-sensitive material being interposed between the first carrier substrate and the second carrier substrate.

20. The method of claim 16, wherein the attaching the first substrate to the first surface of the carrier structure is performed at least in part by using a second adhesive.

21. The method of claim 20, wherein the first adhesive is different from the second adhesive.

\* \* \* \* \*